(12) United States Patent
Chiu et al.

(10) Patent No.: US 8,420,475 B2
(45) Date of Patent: Apr. 16, 2013

(54) PARASITIC VERTICAL PNP BIPOLAR TRANSISTOR AND ITS FABRICATION METHOD IN BICMOS PROCESS

(75) Inventors: Tzuyin Chiu, Shanghai (CN); TungYuan Chu, Shanghai (CN); Wensheng Qian, Shanghai (CN); YungChieh Fan, Shanghai (CN); Donghua Liu, Shanghai (CN); Jun Hu, Shanghai (CN)

(73) Assignee: Shanghai Hua Hong Nec Electronics Company, Limited, Shanghai (CN)

( * ) Notice: Subject to any disclaimer, the term of this patent is extended or adjusted under 35 U.S.C. 154(b) by 92 days.

(21) Appl. No.: 12/975,545

(22) Filed: Dec. 22, 2010

(65) Prior Publication Data

US 2011/0156143 A1    Jun. 30, 2011

(30) Foreign Application Priority Data

Dec. 24, 2009 (CN) .......................... 2009 1 0202031

(51) Int. Cl.
  *H01L 21/8238* (2006.01)
(52) U.S. Cl.
  USPC ............... 438/202; 438/E21.608; 438/234; 438/527; 438/189; 438/222; 257/526; 257/197; 257/592
(58) Field of Classification Search .................. 257/526; 438/202, 207
  See application file for complete search history.

(56) References Cited

U.S. PATENT DOCUMENTS

2002/0160562 A1* 10/2002 Babcock et al. .............. 438/207
2003/0102512 A1*  6/2003 Chatterjee ..................... 257/370

OTHER PUBLICATIONS

Jaeger, Richard C. Introduction to Microelectronic fabrication 2nd edition. p. 145. ISBN 0-201-44494-7. 2002, 1998 Prentince Hall.*

* cited by examiner

*Primary Examiner* — Marcos D. Pizarrro
*Assistant Examiner* — Cesar Lopez
(74) *Attorney, Agent, or Firm* — Ming Chow; Sinorica, LLC

(57) ABSTRACT

This invention published a parasitic vertical PNP bipolar transistor in BiCMOS (Bipolar Complementary Metal Oxide Semiconductor) process; the bipolar transistor comprises a collector, a base and an emitter. Collector is formed by active region with p-type ion implanting layer. It connects a p-type buried layer which formed in the bottom region of STI (Shallow Trench Isolation). The collector terminal connection is through the p-type buried layer and the adjacent active region. The base is formed by active region with n type ion implanting which is on the collector. Its connection is through the original p-type epitaxy layer after converting to n-type. The emitter is formed by the p-type epitaxy layer on the base region with heavy p-type doped. This invention also comprises the fabrication method of this parasitic vertical PNP bipolar in BiCMOS (Bipolar Complementary Metal Oxide Semiconductor) process. And this PNP bipolar transistor can be used as the IO (Input/Output) device in high speed, high current and power gain BiCMOS (Bipolar Complementary Metal Oxide Semiconductor) circuits. It also provides a device option with low cost.

4 Claims, 9 Drawing Sheets

PARASITIC VERTICAL PNP BIPOLAR TRANSISTOR AND ITS FABRICATION METHOD IN BICMOS PROCESS

The current application claims a foreign priority to the application China 200910202031.4 filed on Dec. 24, 2009.

FIELD OF THE INVENTION

This invention relates generally to semiconductor devices in integrated circuits. More particularly it relates to bipolar transistor design and fabrication.

BACKGROUND OF THE INVENTION

Currently the NPN bipolar transistor in BiCMOS (Bipolar Complementary Metal Oxide Semiconductor) process usually use heavy doped collector buried layer to reduce the collector resistance. This process needs high temperature and long time furnace drive-in to make the dopant to diffuse deeper and decrease the capacitance between buried layer and silicon substrate. This process also need n-type heavy implanting (above 1e15 cm–2) to realize n-type buried layer connection and form collector pick-up. The epitaxy layer on the collector buried layer forms the collector. The p-type doped Silicon or SiGe (Silicon Germanium) epitaxy forms the base and the heavy doped polysilicon forms the emitter. The isolation between two transistors is through deep trench isolation process. The existing parasitic PNP bipolar transistor design in BiCMOS (Bipolar Complementary Metal Oxide Semiconductor) process has the very mature and reliable process, but also comes with the disadvantages as below: 1. buried layer needs high temperature and long time furnace drive-in; 2. high cost of collector epitaxy; 3. process complication and high cost of deep trench isolation.

SUMMARY OF THE INVENTION

This invention provides a parasitic vertical PNP bipolar transistor in the BiCMOS (Bipolar Complementary Metal Oxide Semiconductor) process which can be used as the high speed, high current and power gain IO (Input/Output) device and a device option for circuit design. This invention also provides the fabrication method of this parasitic vertical PNP bipolar transistor which without additional process and additional cost.

The active region of this parasitic vertical PNP bipolar transistor is isolated by STI (Shallow Trench Isolation) process. The device comprises:

the collector, which is formed by the first active region with p-type ion implanting. This p-type layer connects the p-type buried layer which formed in the bottom of STI (Shallow Trench Isolation). The p-type buried layer connects the adjacent second active region. The two active regions are connected through the p-type buried layer. The second active has the heavy p-type implantation layer. There is a metal layer and metal contact wherein they form the collector terminal finally.

the base, which is formed on the above mentioned collector region by a n-type ion implanting layer.

the emitter, which is formed by a epitaxy layer on above mentioned base region. This p-type epitaxy layer can be Silicon, SiGe (Silicon Germanium) or SiGeC (Silicon Germanium with Carbon). The emitter layer is connected to the contact metal and forms the emitter terminal.

Part of above p-type layer will be converted to n-type and used to connect the base.

The p-type ion implantation forming the collector is shared with the Pwell (P-type Well) implant condition of MOSFET (Metal Oxide Silicon Field Effect Transistor). The mentioned collector ion implantation comprises three impurity implant layers. And the implant ion impurity is boron: the first layer wherein the implant condition is dose range from 1e12~5e13 cm–2 and energy range from 200~300 keV; the second layer wherein the implant condition is dose range from 5e11~1e13 cm–2 and energy range from 25~200 keV; the third layer wherein the implant condition is dose range is from 1e11~1e13 cm–2 and energy range is from 5~25 keV.

An n-type ion implantation to form base uses the NLDD (N-type Lightly Doped Drain) implant condition of NMOS (N-type Metal Oxide Semiconductor). The implanting species is phosphorus or arsenic, dose range is 5e12~1e15 cm–2 and energy range is 10~60 keV.

A p-type epitaxy layer formed on base region and doped with boron, this p-type epitaxy layer shares the process condition of the base layer of NPN bipolar transistor. The emitter formed by the mentioned p-type epitaxy layer comprises intrinsic doped and implanted impurities: the implanted impurities shares the process condition of extrinsic base implant of NPN bipolar transistor which the implant species can be boron, BF2 or indium, the implant dose range is 5e12~1e15 cm–2 and energy range is 5~60 keV.

An inverse layer formed by part of above mentioned p-type epitaxy layer and a n-type polysilicon. The inversed n-type epitaxy layer comprises the p-type epitaxy layer which is compensated by n-type impurity from above mentioned n-type polysilicon wherein the concentration of n-type impurity from n-type polysilicon is higher than that of the p-type epitaxy layer. The n-type doping condition of n-type polysilicon shares the process condition of n-type source/drain of MOSFET (Metal Oxide Silicon Field Effect Transistor) wherein the n-type polysilicon comprises two n-type impurities: the first layer n-type impurity with phosphorus implant, dose range 1e12~1e14 cm–2 and energy range 20~60 keV; the second n-type impurity with phosphorus or arsenic implant, dose range 1e14~1e16 cm–2 and energy range is 5~50 keV.

The fabrication method of this BiCMOS (Bipolar Complementary Metal Oxide Semiconductor) parasitic vertical PNP bipolar transistor comprises: Active region and STI (Shallow Trench Isolation) are formed on silicon substrate; The p-type buried layer connecting with collector region is formed by p-type implant on the STI (Shallow Trench Isolation) bottom with dose range 1e14~1e16 cm$^{-2}$; Field oxide filling on STI (Shallow Trench Isolation); Collector region is formed by p-type ion implanting, which is share the Pwell implant condition of MOSFET (Metal Oxide Silicon Field Effect Transistor) and following the RTA (Rapid Thermal Anneal) process to diffuse the p-type buried layer make the two regions connected; Base region is formed by a n-type ion implanting above the mentioned collector region; a p-type epitaxy layer on the base region with intrinsic doping, the doped species is boron; the epitaxy layer can be Silicon, SiGe or SiGeC; part of the p-type epitaxy layer will be converted to n-type in coming process; Emitter region is formed by the epitaxy layer on the base region with high dose p-type doping, the p-type dopant can be Boron, BF2 or Indium; The contact metal connects collector, base and emitter.

This parasitic vertical PNP bipolar transistor has a current gain high than 15 and good frequency characteristics. The transistor can be used as the high speed and high current & power current IO device and one more choice for circuit design. The fabrication method of this parasitic transistor adapts the existing Pwell implanting, NLDD (N-type Lightly Doped Drain) implanting, base epitaxy layer of NPN bipolar transistor in BiCMOS (Bipolar Complementary Metal Oxide Semiconductor) process without additional process and cost. This invention also avoids use the buried layer, collector epitaxy and deep trench isolation process and drive the cost low more.

BRIEF DESCRIPTION OF THE DRAWINGS

The foregoing and the object, features, and advantages of the invention will be apparent from the following detailed description of the invention, as illustrated in the accompanying drawings, in which.

DETAILED DESCRIPTION OF THE INVENTION

Figure 1:
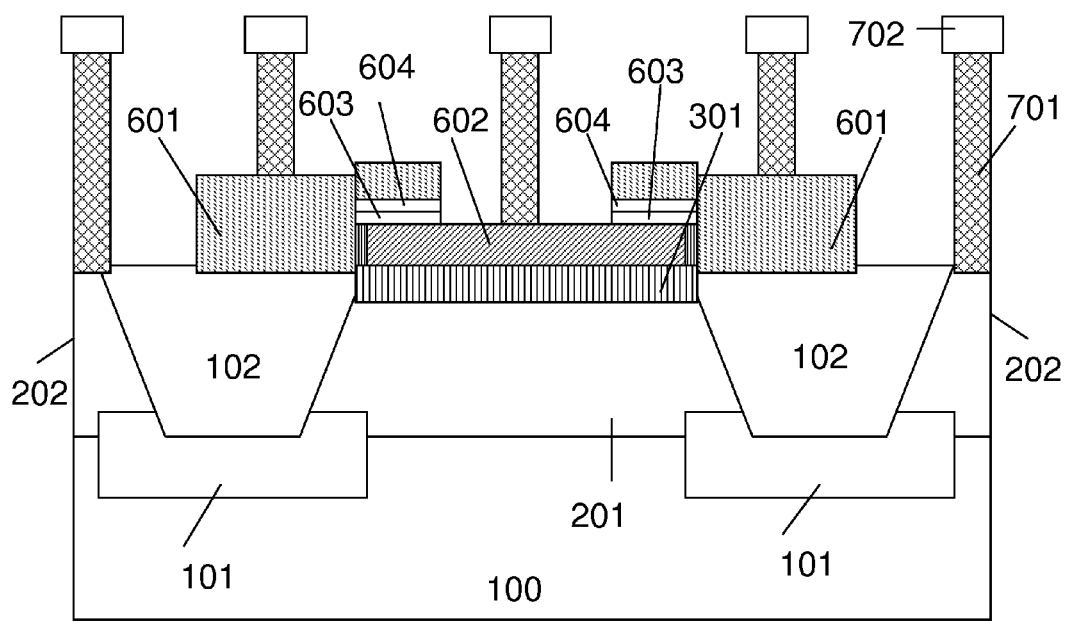
FIG. 1 is the cross section of the parasitic vertical PNP bipolar transistor of this invention.

FIG. 1 illustrates the parasitic vertical PNP in BiCMOS (Bipolar Complementary Metal Oxide Semiconductor) process of this invention. The active region is isolated by STI field oxide which is the STI 102 on silicon substrate 100 as showed in FIG. 1. The PNP bipolar transistor structure comprises a collector 201, a base 301 and an emitter 602.

The collector 201 is formed by the p-type ion implanting layer in the first active region. This p-type implantation shares the Pwell implant of MOSFET of the BiCMOS process. The Pwell implantation has three steps: the first step, implanting species is boron, dose range from 1e12~5e13 cm−2 and energy range from 200~300 keV; the second step, implanting species is boron, dose range from 5e11~1e13 cm−2 and energy range from 25~200 keV; the third step, implanting species is boron, dose range from 1e11~1e13 cm−2 and energy range from 5~25 keV. Or only use the condition of the second and the third step to form the p-type collector layer. This collector region 201 connects a p-type buried layer 101. The p-type buried layer 101 is formed in the bottom of STI and surrounds the collector active region 201. It use a p-type ion implanting with the dose 1e14~1e16 cm−2 which happens after STI etch and before field oxide filling. And during this p-type buried layer implanting, a hard mask on the active region and a STI side spacer or photo resist is used as block layer to avoid the ion induced into active region and its side wall. The p-type ion will laterally diffuse into active region with a distance similar to its vertical depth. This p-type buried layer 101 also connects the second active region 202. Two active regions (201 & 202) are connected through the p-type buried layer 101. The second active has the heavy p-type implantation and connected to the contact metal and forms the collector terminal finally.

The base region 301 is formed by n-type implanting region which is on the collector region 201. This n-type ion implantation to form base 301 uses the NLDD implant condition of NMOS. The implanting species is phosphorus or arsenic, dose range is 5e12~1e15 cm−2 and energy range is 10~60 keV.

The emitter region 602, a p-type epitaxy on base region 301, is intrinsic doped with boron. The doping method and epitaxy method is same as the method of forming base of NPN bipolar transistor. The epitaxy layer becomes a heavy doped emitter after the p-type implanting which is shared with NPN bipolar transistor extrinsic base implantation. The implant species can be boron, BF2 or indium. The implant dose range is 5e12~1e15 cm−2 and energy range is 5~60 keV.

Part of the p-type epitaxy layer on base region 301 will be converted to n-type and is connected with the base region 301. The method is: firstly, a polysilicon layer is deposited; the source/drain implant of NMOS is induced in this region; after the RTA process, the n-type impurity in polysilicon diffuse fast which makes specified p-type epitaxy region converted to n-type and finally forms the poly silicon region 601 illustrated in FIG. 1. And the connects the n-type base region 301 is connected with 601. The above mentioned NMOS source/drain heavy doping comprises two steps: the first step is phosphorus implant, the dose range is 1e12~1e14 cm−2 and energy range is 20~60 keV; the second step is phosphorus or arsenic implant, the dose range is 1e14~1e16 cm−2 and energy range is 5~50 keV.

The illustration of FIG. 2A to FIG. 2F is cross section structure of the new invented parasitic vertical PNP bipolar transistor at different process step during fabrication.

Figure 2A:
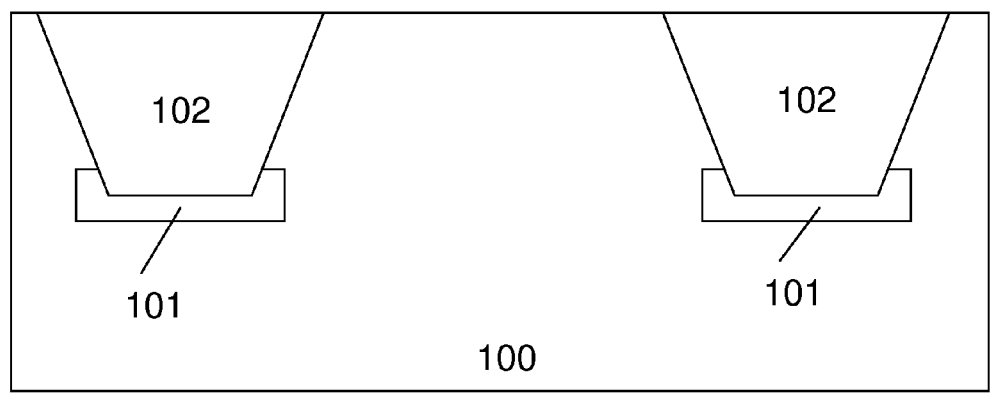
FIG. 2A to FIG. 2F is the cross section the parasitic vertical PNP bipolar transistor at different process steps.

Process step 1, as illustrated by FIG. 2A, active region and STI 102 are formed on silicon substrate 101; the p-type buried layer 101 The p-type buried layer 101 is formed in the bottom of STI with the implant dose 1e14~1e16 cm−2. And during this p-type buried layer implanting, a hard mask on the active region and a STI side spacer or photo resist is used as block layer to avoid the ion induced into active region and its side wall. Field oxide formation is the STI as illustrated in FIG. 2A filled by oxide.

Figure 2B:
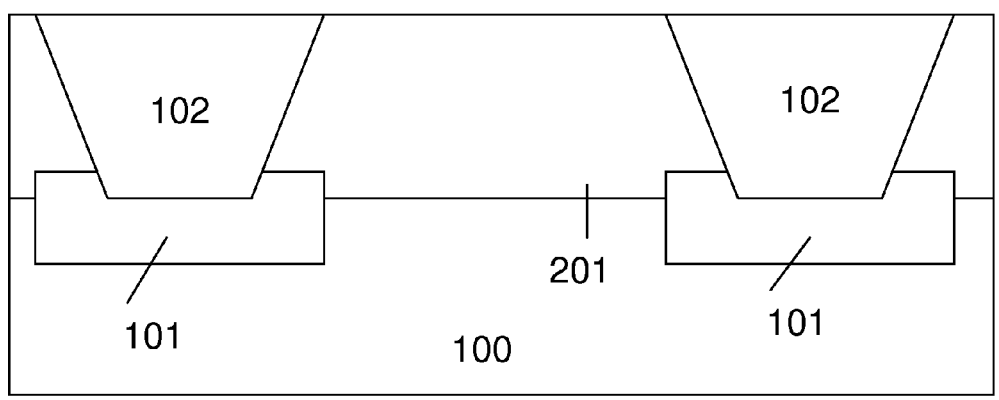

Process step 2, as illustrated by FIG. 2B, the collector region 201 is formed by the p-type ion implanting layer in the first active region. This p-type implantation shares the Pwell implant of MOSFET of the BiCMOS process. The Pwell implantation has three steps: the first step, implanting species is boron, dose range is from 1e12~5e13 cm−2 and energy range is from 200~300 keV, which forms the first implanted impurity layer of collector; the second step, implanting species is boron, dose range is from 5e11~1e13 cm−2 and energy range is from 25~200 keV, which forms the second implanted impurity layer of collector; the third step, implanting species is boron, dose range is from 1e11~1e13 cm−2 and energy range is from 5~25 keV, which forms the third implanted impurity layer of collector. Another active region 202 is heavily doped by p-type ion implanting to form the collector pick-up. Use RTA process to make the p-type layer 101 laterally diffused into two active regions (201 & 202) and connects the 201 & 202.

Figure 2C:
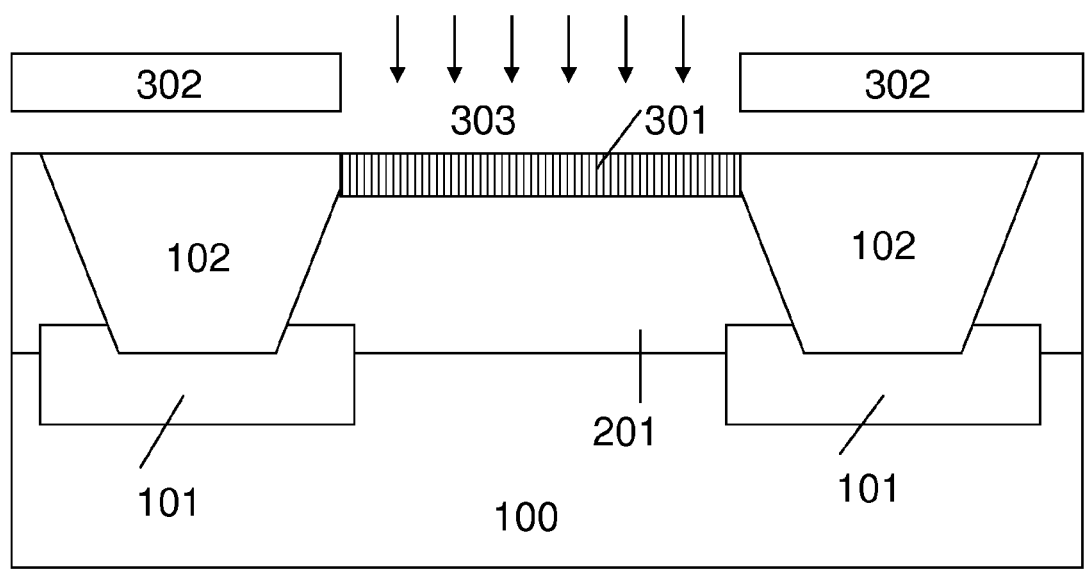

Process step 3, as illustrated by FIG. 2C, base region 301 is formed by n-type implanting region which is on the collector region 201. This n-type ion implantation to form base 301 uses the NLDD implant 303 of NMOS. The implanting species is phosphorus or arsenic, dose range is 5e12~1e15 cm−2 and energy range is 10~60 keV. Implanting area is defined by photo resist 302.

Figure 2D:
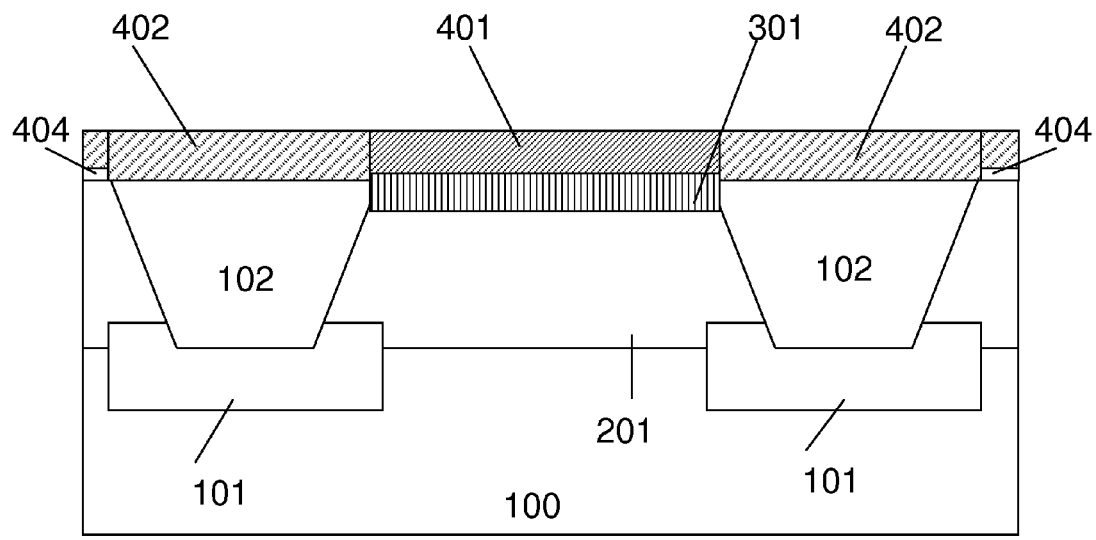

Process step 4, as illustrated by FIG. 2D, firstly a oxide film 404 and polysilicon film are deposited (this polysilicon film is optional). And the films are etched away on the base region 301. After etch, a p-type epitaxy on base region 301, is intrinsic doped with boron. The doping method and epitaxy method is same as the method of forming base of NPN bipolar transistor. This epitaxy layer will form single crystal 401 on silicon region and form polysilicon 402 on oxide or polysilicon region. The p-type epitaxy layer can be silicon, SiGe or SiGeC.

Figure 2E:
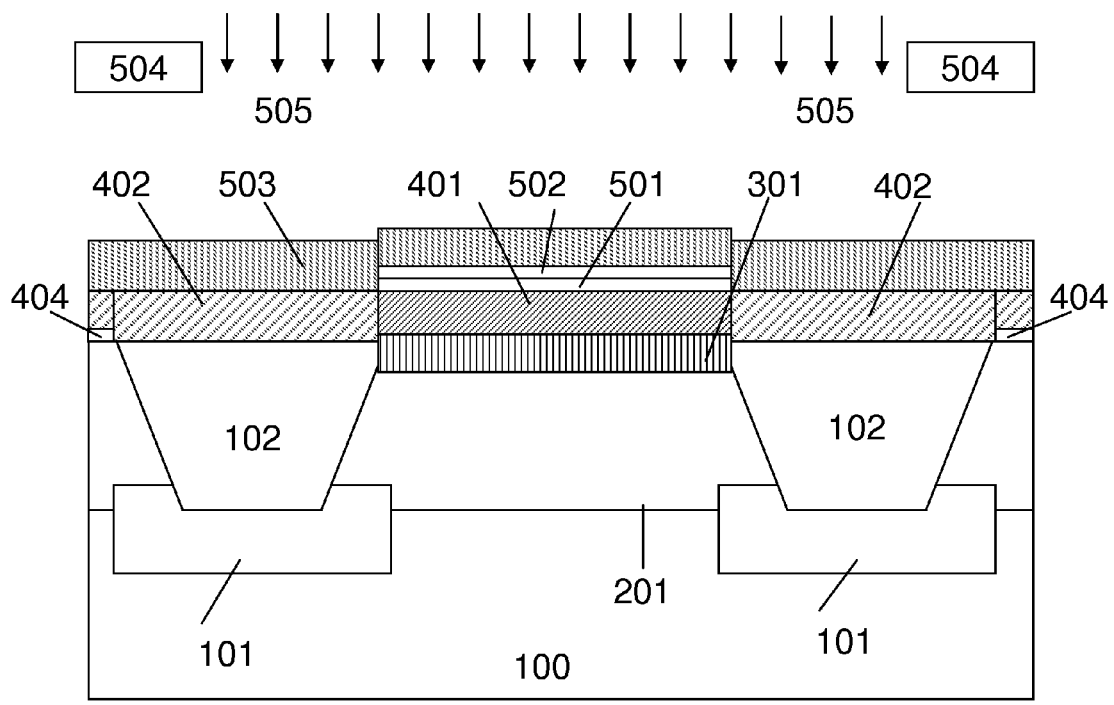

Process step 5, as illustrated by FIG. 2E, a 10~50 nm thickness oxide film 501 and a 10~50 nm thickness nitride file 502 are deposited on p-type epitaxy layer 401 & 402. Then etch this film away on the region except the region 401. The remained film is used to isolate the following deposition polysilicon layer 503 with thickness 150~350 nm. The remained oxide/nitride layer is the block film of emitter region 602 (in FIG. 2G), which size can be same as the collector active region 201 or smaller than it. It also can be a little bit larger than region 201, but it can not be much. The polysilicon layer 503 can be n-type in-situ doped or undoped. The dopants can be phosphorus or arsenic if it is in-situ doped. In order to reduce the resistance, additional heavy n-type implantation is needed for this polysilicon layer 503. This implanting usually is only for 503. It also can adapt the source/drain implant 505 of NMOS. Or both implantations are used. The implanting region is defined by photo resist 504. If just for the new invented parasitic vertical PNP bipolar transistor, this implantation also can be blank implanting. The above mentioned n-type ion implanting or NMOS source/drain heavy doping comprises two steps: first step is phosphorus implant, the dose range is 1e12~1e14 cm−2 and energy range is 20~60 keV; the second step is phosphorus or arsenic implant, the dose range is 1e14~1e16 cm−2 and energy range is 5~50 keV.

Figure 2F:
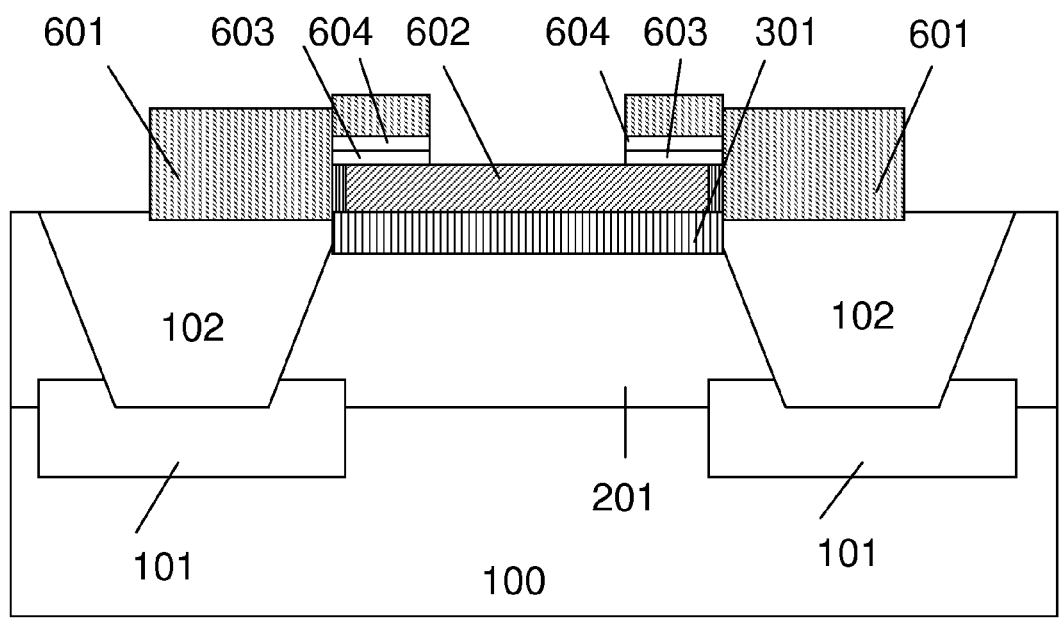

Process step 6, as illustrated by FIG. 2F, emitter region 602 is formed by p-type epitaxy layer 401 with heavy p-type ion implanting. Oxide layer 603 (the oxide 501 in FIG. 2E) and nitride layer 604 (the nitride 502 in FIG. 2E) and the polysilicon are etched to form the window of emitter region 602. The heavy p-type doping was a implanting through this window. The implant species can be boron, BF2 for indium. This implantation can share the extrinsic base implant process of the NPN bipolar transistor of BiCMOS (Bipolar Complementary Metal Oxide Semiconductor). The implant dose is 5e12~1e15 cm−2 and energy is 5~60 keV. After the RTA, the emitter region 602 is finally formed. The doping concentration of emitter region 602 is much higher than the base region 301 which is formed by NLDD implantation of NMOS. So he PN junction will be pushed into NLDD side. Meanwhile the RTA process leads the n-type species quickly lateral and vertical diffusion in the polysilicon 503, which can convert the p-type epitaxy layer 402 & part of 401 close to 402 to n-type 601. Thus the base region 301 is connected with 601. Finally, as illustrated FIG. 1, through the contact metal on active region 202, emitter region 602 and n-type polysilicon 601, the collector 201, emitter region 602 and base region 301 are connected to metal line 702 through contact 701 (as shown in FIG. 1).

Figure 3A:
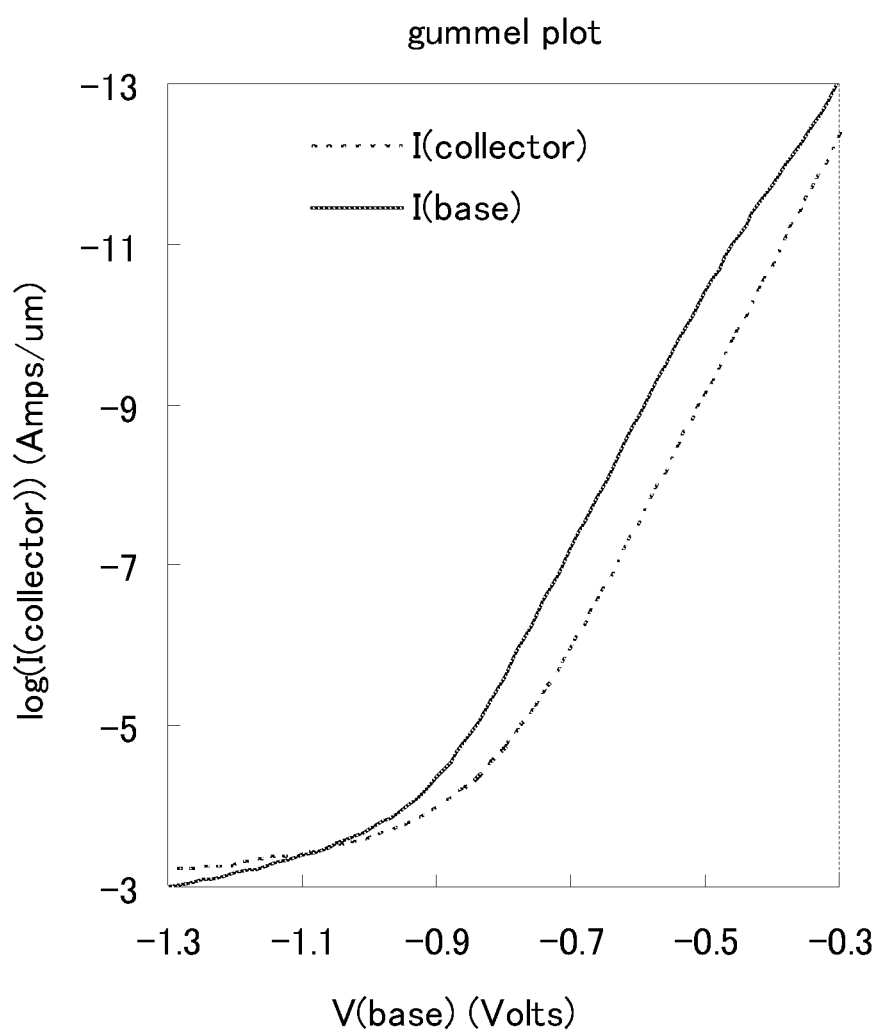
FIG. 3A is the Gummel plot of this parasitic vertical PNP bipolar transistor from TCAD simulation.
Figure 3B:
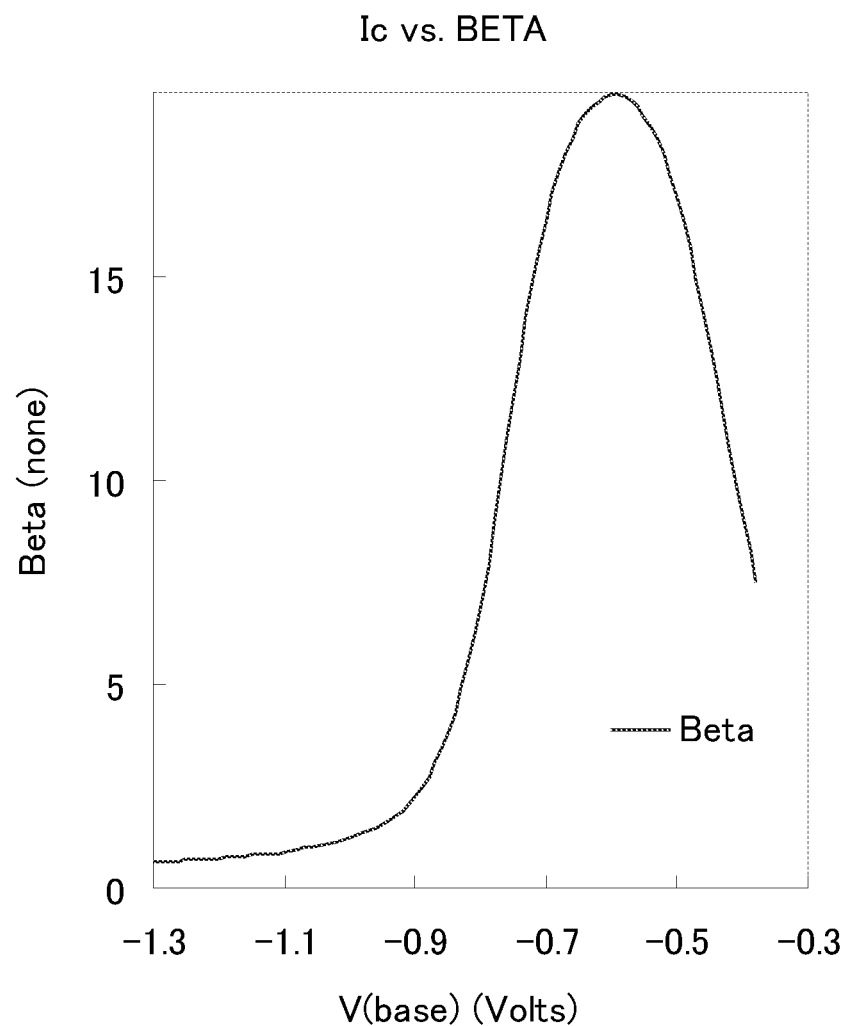
FIG. 3B is the current gain (Beta) of this parasitic vertical PNP bipolar transistor from TCAD simulation.

As illustrated by FIG. 3A and FIG. 3B, the Gummel plot and current gain (Beta) curves of this parasitic vertical PNP bipolar transistor are got by TCAD simulation. Upon the simulation result, it shows that heavy p-type doping of buried layer is effective to reduce collector connecting resistance; the p-type epitaxy layer 402 (polysilicon) was converted to n-type and connects with n-type base region 301 successfully. The silicon epitaxy, SiGe or SiGeC epitaxy as emitter forms the emitter-base pn junction well with base which is induced by NLDD implantation.

Above illustration is detailed transistor information and fabrication method of this invention, but this invention is not limited by those illustration. Other modification and improvement based on the same mechanism of this invention are protected by this invention.

The invention claimed is:

1. A fabrication method of parasitic vertical PNP bipolar transistor in BiCMOS (Bipolar Complementary Metal Oxide Semiconductor) process, wherein:
   forming an active region and STI (shallow trench isolation) on a silicon substrate;
   forming a p-type buried layer which is connected with a collector region by p-type implantation on the STI (Shallow Trench Isolation) bottom with dose range of 1e14~1e16 cm$^{-2}$;
   filling a field oxide on the STI (shallow trench isolation);
   forming the collector region by p-type ion implanting which shares the Pwell (P-type well) implant condition of MOSFET (Metal Oxide Silicon Field Effect Transistor) and follows a RTA (Rapid Thermal Anneal) process to drive the p-type buried layer impurity diffuse and make the two active regions connected;
   forming a base region by a n-type ion implantation above the collector region;
   forming a p-type epitaxy layer on the base region with intrinsic doping the doped species for the intrinsic doping is boron;
   the p-type epitaxy layer is selected from Silicon, SiGe (Silicon Germanium) or SiGeC (Silicon Germanium with Carbon);
   forming an emitter region by the p-type epitaxy layer on the base region with a high dose p-type doping, wherein the p-type dopant is Boron, BF2 or Indium; and
   connecting the collector, the base and the emitter with a contact metal,
   wherein part of the p-type epitaxy layer is converted to n-type and connected with the base region by the following steps:
   firstly, a polysilicon layer is deposited; the source/drain implant of NMOS (N-type Metal Oxide Semiconductor) is induced in this region; and
   secondly, after a RTA process, the fast diffuse of n-type impurity in polysilicon makes specified p-type epitaxy region converted to n-type and connects the n-type base region,
   wherein the NMOS source/drain implant comprises two steps:
   the first step is phosphorus implant, the dose range is 1e12~1e14 cm$^{-2}$ and energy range is 20~60 keV; and
   the second step is phosphorus or arsenic implant, the dose range is 1e14~1e16 cm$^{-2}$ and energy range is 5~50 keV.

2. The fabrication method of the parasitic vertical PNP bipolar transistor in BiCMOS (Bipolar Complementary Metal Oxide Semiconductor) process of claim 1, wherein the p-type ion implantation forming the collector is shared with the Pwell implant condition of MOSFET (Metal Oxide Silicon Field Effect Transistor);
   the pwell implantation has three steps:
   (1), implanting species is boron, dose range is from 1e12~5e13 cm$^{-2}$ and energy range is from 200~300 keV,
   (2), implanting species is boron, dose range is from 5e11~1e13 cm$^{-2}$ and energy range is from 25~200 keV,
   (3), implanting species is boron, dose range is from 1e11~1e13 cm$^{-2}$ and energy range is from 5~25 keV.

3. The fabrication method of the parasitic vertical PNP bipolar transistor in BiCMOS (Bipolar Complementary Metal Oxide Semiconductor) process of claim 1, wherein the n-type ion implantation forming the base uses the NLDD (N-type Lightly Doped Drain) of MOSFET (Metal Oxide Silicon Filed Effect Transistor) implant condition of NMOS (N-type Metal Oxide Semiconductor), wherein the implanting species is phosphorus or arsenic, dose range is 5e12~1e15 cm$^{-2}$ and energy range is 10~60 keV.

4. The fabrication method of the parasitic vertical PNP bipolar transistor in BiCMOS (Bipolar Complementary Metal Oxide Semiconductor) process of claim 1, wherein the p-type epitaxy layer is adapted the process condition of base epitaxy process of NPN bipolar transistor in which the intrinsic doping, thickness and doping profile is following the NPN process;
   sharing the heavy doped emitter after the p-type implanting with NPN bipolar transistor extrinsic base implantation;
   the implant species can be boron, BF2 or indium. The implant dose range is 5e12~1e15 cm$^{-2}$ and energy range is 5~60 keV.

* * * * *